United States Patent
Cha et al.

(10) Patent No.: US 6,680,239 B1
(45) Date of Patent: Jan. 20, 2004

(54) EFFECTIVE ISOLATION WITH HIGH ASPECT RATIO SHALLOW TRENCH ISOLATION AND OXYGEN OR FIELD IMPLANT

(75) Inventors: Cher Liang Cha, Singapore (SG); Kok Keng Ong, Singapore (SG); Alex See, Singapore (SG); Lap Chan, San Francisco, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 165 days.

(21) Appl. No.: 09/624,025

(22) Filed: Jul. 24, 2000

(51) Int. Cl.[7] ............................................. H01L 21/76
(52) U.S. Cl. .................................................... 438/435
(58) Field of Search ............................. 438/295, 424, 438/425, 427, 435, 296

(56) References Cited

U.S. PATENT DOCUMENTS

| | | | |
|---|---|---|---|
| 5,094,972 A | | 3/1992 | Pierce et al. ................... 437/67 |
| 5,401,998 A | | 3/1995 | Chiu et al. ................... 257/368 |
| 5,643,822 A | * | 7/1997 | Furukawa et al. ........... 438/421 |
| 5,712,186 A | | 1/1998 | Thakur et al. ................ 437/69 |
| 5,783,476 A | * | 7/1998 | Arnold ........................ 438/425 |
| 5,877,048 A | | 3/1999 | Wu .............................. 438/199 |
| 5,904,540 A | * | 5/1999 | Sheng et al. ................. 438/427 |
| 5,943,579 A | | 8/1999 | Tran ............................ 438/370 |
| 5,989,978 A | * | 11/1999 | Peidous ....................... 438/436 |
| 6,069,057 A | * | 5/2000 | Wu .............................. 438/424 |
| 6,093,611 A | * | 7/2000 | Gardner et al. ............. 438/295 |

* cited by examiner

*Primary Examiner*—Carl Whitehead, Jr.
*Assistant Examiner*—David S Blum
(74) *Attorney, Agent, or Firm*—George O. Saile; Rosemary L. S. Pike

(57) ABSTRACT

A method for forming shallow trench isolation (STI) with a higher aspect ratio is given. This method allows the formation of narrower and deeper trench isolation regions while avoiding substrate damage due to excessive etching and severe microloading effects. In addition, it yields uniform depth trenches while avoiding problems of etch residue at the bottom of the trench. This method is achieved by using a process where a trench is etched, and an oxide layer grown along the bottom and sidewalls of the trench. Oxygen or field isolation ions are then implanted into the bottom of the trench. A nitride spacer is then formed along the bottom and sidewalls of the trench, followed by an isotropic etch removing the nitride and oxide from the bottom of the trench. An oxide deposition then fills the trench, followed by a planarization step completing the isolation structure.

17 Claims, 3 Drawing Sheets

EFFECTIVE ISOLATION WITH HIGH ASPECT RATIO SHALLOW TRENCH ISOLATION AND OXYGEN OR FIELD IMPLANT

BACKGROUND OF THE INVENTION (1) Field of the Invention

The invention generally relates to an isolation process used in semiconductor manufacturing and, more particularly, to a method of shallow trench isolation used to isolate adjacent components in sub-micron devices in the fabrication of integrated circuits.

(2) Description of Prior Art

Semiconductor fabrication often employs shallow trench isolation (STI) to provide electrical isolation between adjacent components. Typically, a narrow trench is isotropically etched and filled with a dielectric such as silicon oxide to provide the isolation. As device packing density increases, STI becomes an inevitable feature of the integrated circuit. In deep sub-micron integration STI with higher aspect ratios (height/width) are required.

Using prior techniques, deep and narrow trenches are difficult to etch. Several undesirable effects may arise from devices employing high aspect ratio STI. These include damage to the substrate due to excessive etching and severe microloading effects between dense and open trenches. Additionally, problems may result from incomplete clearing of etch by-product residue at the bottom of narrow trenches.

Other approaches to improve isolation exist. U.S. Pat. No. 5,094,972 to Pierce et al. teaches a method of planarizing an integrated circuit with recessed isolation regions. Boron is implanted at an angle along trench sidewalls to form a channel stop isolation region. Unfortunately, this approach severely limits future scaling of device dimensions. Since boron implantation is only used for narrow trenches, additional masking steps are required to protect wider trenches. U.S. Pat. No. 5,401,998 to Chiu et al teaches a method where angled trenches are formed and then implanted with boron. The trenches are then filled with oxide. The boron prevents inversion of the sidewalls thus avoiding parasitic leakage between n-type source and drain regions. U.S. Pat. No. 5,877,048 to Wu teaches a method where an oxygen implant is used to form buried isolation regions in the substrate. Active devices are then built on top of the oxygen implanted isolation regions. U.S. Pat. No. 5,712,186 to Thakur et al teaches a method where oxygen is implanted below the surface of a field oxide. Thermal oxidation is then used to grow oxide above the implanted oxygen forming a deeper isolation region. This invention requires high-energy ion implantation generating undesirable defects that may result in leakage paths. Thermal oxidation suffers from many problems. It requires high temperature processing techniques not compatible with current technology. In addition, thermal oxide suffers a lack of adequate oxide depth resulting in poor isolation. Thermal oxide grows poorly in narrow trenches and results in a surface topology requiring additional planarization U.S. Pat. No. 5,943,579 to Tran teaches a method where a field implantation under the field oxide (FOX) in non-active areas forms isolation regions.

SUMMARY OF THE INVENTION

A principal object of the present invention is to provide a process that allows the formation of narrower and deeper trench isolation regions.

Another object of the present invention is to provide a method that avoids substrate damage due to excessive etching.

Another object of the present invention is to provide a method that avoids severe microloading effects between dense and open trenches.

Yet another object of the present invention is to provide a method that yields uniform depth trenches while avoiding problems of etch residue at the bottom of the trench.

These objects are achieved by using a process where a trench is etched, and an oxide layer grown along the bottom and sidewalls of the trench. Oxygen or field isolation ions are then implanted into the bottom of the trench. A nitride spacer is then formed along the bottom and sidewalls of the trench, followed by an isotropic etch removing the nitride and oxide from the bottom of the trench. An oxide deposition then fills the trench, followed by a planarization step completing the isolation structure.

BRIEF DESCRIPTION OF THE DRAWINGS

In the accompanying drawings forming a material part of this description, there is shown.

DESCRIPTION OF THE PREFERRED EMBODIMENTS

Figure 1:
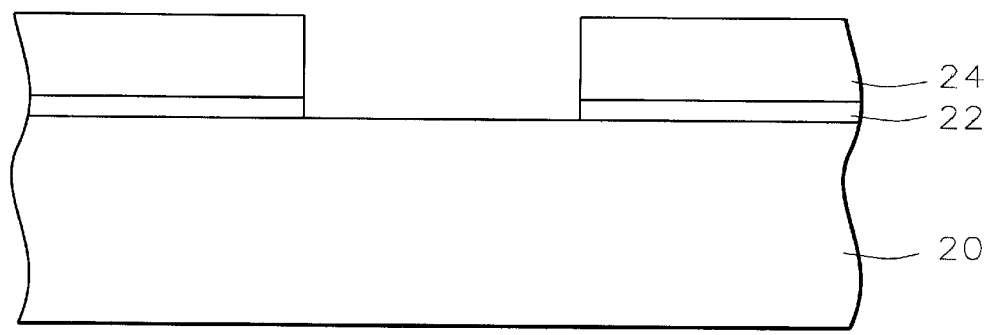
FIGS. 1 through 5 schematically illustrating in cross-sectional representation a preferred embodiment of the present invention.

Referring now more particularly to FIG. 1, a substrate 20 is shown where a pad oxide 22 has been grown or deposited to a thickness of between about 200 to 500 Angstroms. The pad oxide 22 is preferably grown using conventional wet or dry techniques, but may be deposited by one of the following methods: chemical vapor deposition (CVD), low pressure CVD (LPCVD), jet vapor deposition (JVD), liquid phase deposition (LPD), remote plasma deposition (RPD), or rapid thermal oxidation (RTO). This is followed by a nitride layer 24 deposition by pressure enhanced CVD (PECVD) or more preferably by LPCVD, for example, to a thickness of between about 500 to 1500 Angstroms. The pad oxide 22 and nitride layer 24 are then patterned and etched using a chemistry of $HBr/SF_6$, for example, to form an opening to the substrate 20 as shown in FIG. 1.

Figure 2:
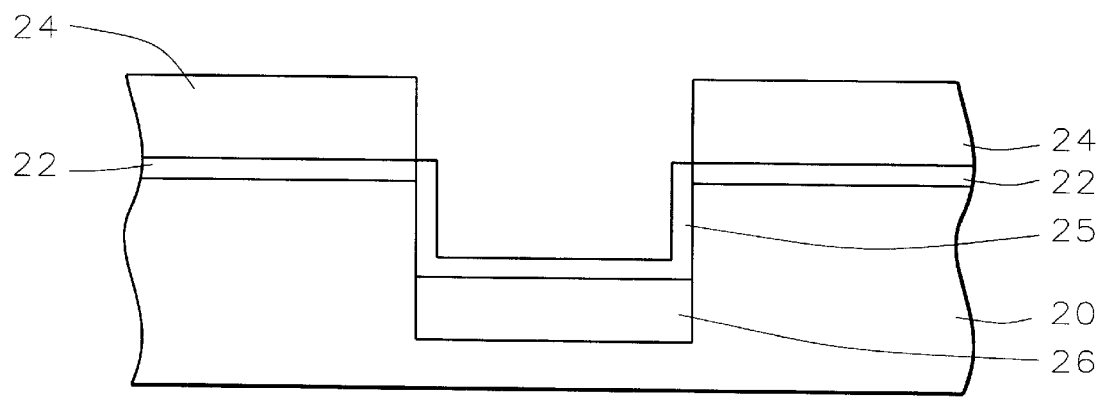

Referring now to FIG. 2, the exposed area of the substrate 20 is anisotropically etched using $HBr/SF_6$, for example, to form a trench with a depth of between about 1500 to 3000 Angstroms. This is followed by a thermal oxidation by conventional techniques forming a second oxide liner layer 25 in the trench with a thickness of between about 200 to 250 Angstroms. An oxygen or field isolation implantation is performed into the trench area forming an implanted region 26. An oxygen implantation would be performed using $O_2$ ions with a dose of between about 1015 to 1017 atoms/cm$^2$ with energy of between about 60 to 80 keV. A field isolation implantation would be performed using ions from a list comprising boron, $BF_2$, phosphorous, arsenic, germanium, or antimony, with a dose of between about 1012 to 1013 atoms/cm$^2$ with energy, of between about 30 to 60 keV. The lower energy implantation serves to extend the shallow trench depth and results in a substantial reduction in defects over the high-energy implantation and additional masking steps required of prior art techniques. Using this method to extend the trench circumvents the problems of etching deep, narrow trenches including microloading and severe plasma induced damage resulting from excessive etching, defects formed along the exposed trench surfaces, and ineffective removal of etch residue. The field isolation implantation differs from the prior art by implanting only at the bottom of the trench. This allows further scaling of devices and avoids trench overlap at the bottom and sidewalls of the trench.

Figure 3:
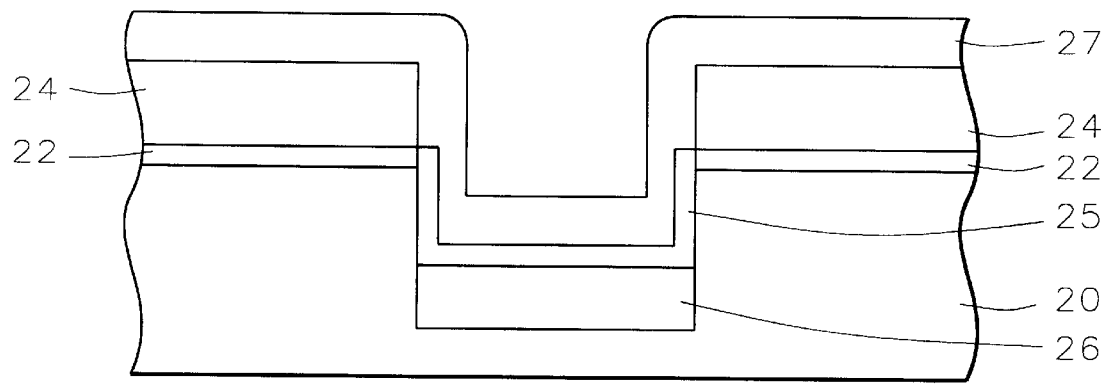

Now referring to FIG. 3, a second nitride layer 27 is deposited by PECVD or preferably by LPCVD to a thickness of between about 200 to 250 Angstroms overlying the entire surface of the wafer.

Figure 4:
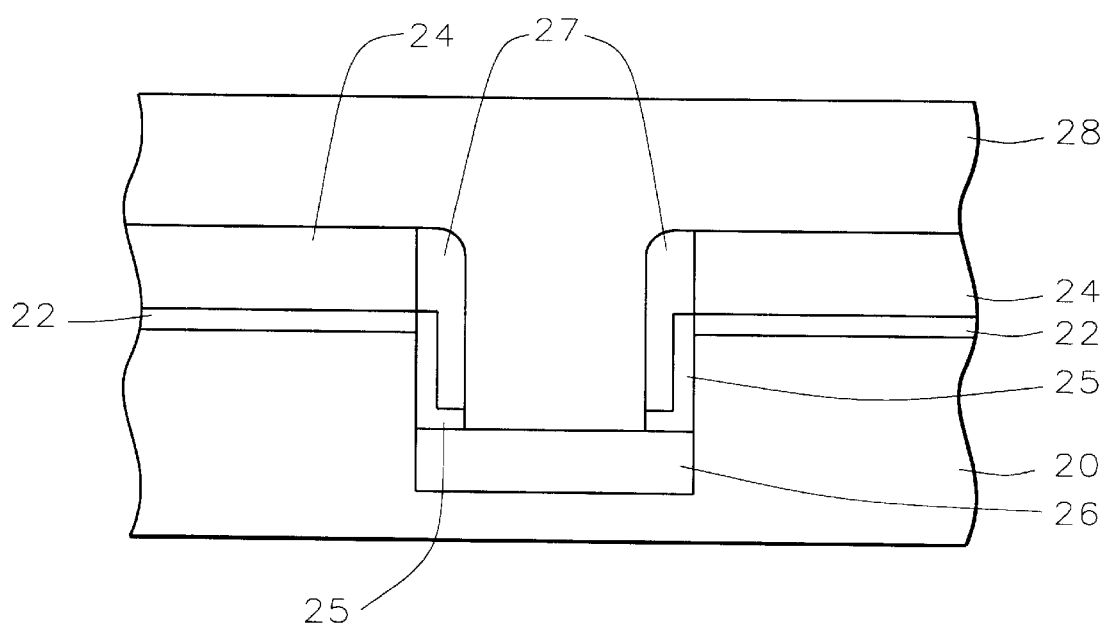

Referring to FIG. 4, the second nitride layer 27 and second oxide layer 25 are anisotropically dry etched using a controlled fluorine based chemistry removing the nitride layer 27 and oxide liner layer 25 in the area at the bottom of the trench, and forming nitride spacers 27 along the sides of the trench. This exposes the implanted silicon oxide region 26. The nitride spacers 27 improve the quality of the isolation region by preventing lateral dopant diffusion during subsequent processing. In addition, elimination of the nitride spacers 27 would allow the formation of undesirable voids in the surface of the oxide of the finished isolation region. A thick oxide layer 28 is then deposited by CVD, LPCVD, or preferably by high-density plasma deposition (HDP) to a thickness of between about 8000 to 10000 Angstroms covering the surface and filling the trench. Stresses induced by the nitride spacers 27 are relieved by the surrounding oxide liner layer 25 and oxide layer 28. Use of a thermally grown oxide in this step would result in poor isolation due to voids, and the resulting surface topology using thermal oxide would require additional planarization. In addition, high temperatures required to grow thermal oxide would not be compatible with current processing technologies.

Figure 5:
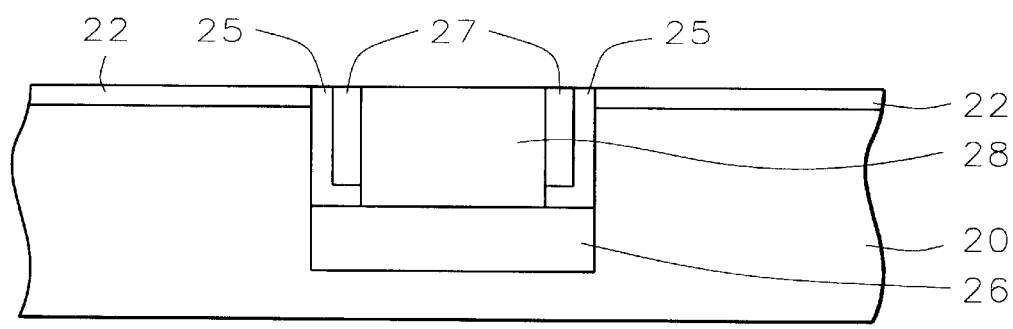

Referring now more particularly to FIG. 5, chemical mechanical polishing (CMP), for example, is used to remove all oxide and nitride layers above the surface of the pad oxide 22. This results in a planarized top surface, and a trench filled with the second oxidation layer 25, the second nitride layer 27 serving as a sidewall spacer, and the thick oxide layer 28.

The invention resolves the problems with existing STI processes using simple techniques and existing processes. The method consumes very little of the active silicon area and does not compromise the salicidation areas for sources and drains. The implanted region serves as an extended STI region and is effective in either a n-type or p-type substrate. The entire process is self-aligning and facilitates subsequent processing steps. By providing a deeper effective trench depth, improved isolation between active devices results. The method eliminates the substrate damage caused by excessive etching required to achieve deeper trenches using prior techniques. It also eliminates microloading effects between dense and open trenches because the trenches do not need to be etched as deeply. In addition, since the etch depth is shallower, the problems associated with ineffective clearing of the trench are diminished.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit isolation region comprising:

providing a semiconductor substrate;

forming a first oxide layer overlying said substrate;

depositing a first nitride layer overlying said first oxide layer;

patterning and etching away a portion of said first nitride layer and said first oxide layer forming an opening to said substrate;

anisotropically etching said substrate in the area of said opening to form a trench;

thermally growing a second oxide layer on the surface of said trench;

implanting ions through said second oxide layer into said substrate underlying the bottom surface only of said trench thereby forming an implanted region underlying said trench;

depositing a second nitride layer overlying said first nitride layer and covering the surface of said second oxide layer on the surface of said trench;

anisotropically etching said second nitride layer and said second oxide layer at the bottom of said trench thereby forming nitride spacers on sidewalls of said trench and exposing said implanted region;

depositing a third oxide layer to fill said trench; and planarizing said third oxide layer completing fabrication of said integrated circuit isolation region.

2. The method according to claim 1 wherein said first oxide layer is grown by wet or dry thermal oxidation to a thickness of between about 200 to 500 Angstroms.

3. The method according to claim 1 wherein said first and second nitride layers are deposited by low pressure chemical vapor deposition (LPCVD) using $NH_3$ and $SiH_4$ at approximately 700° C. to a thickness of between about 500 to 1500 Angstroms.

4. The method according to claim 1 wherein said second oxide layer is grown by dry thermal oxidation at 1000° C. for 30 to 40 minutes to a thickness of between about 200 to 250 Angstroms.

5. The method according to claim 1 wherein said ions are oxygen implanted at a dose of between about $10^{15}$ to $10^{17}$ atoms/cm$^2$ at an energy of between about 60 to 80 keV.

6. The method according to claim 1 wherein said ions comprise one of a group containing B, $BF_2$, P, As, Ge, and Sb implanted at a dose of between about $10^{12}$ to $10^{13}$ atoms/cm$^2$ at an energy of between about 30 to 60 keV.

7. The method according to claim 1 wherein said third oxide layer is deposited by high density plasma deposition at a thickness of between about 6000 to 10,000 Angstroms.

8. A method of fabricating an integrated circuit isolation region comprising:

providing a semiconductor substrate; forming a first oxide layer overlying said substrate;

depositing a first nitride layer overlying said first oxide layer;

patterning and etching away a portion of said first nitride layer and said first oxide layer forming an opening to said substrate;

anisotropically etching said substrate in the area of said opening to form a trench;

thermally growing a second oxide layer on the surface of said trench;

implanting oxygen ions at a dose of between $10_{15}$ to $10^{17}$ atoms/cm$^2$ at an energy of between 60 to 80 keV through said second oxide layer into said substrate underlying the bottom surface only of said trench thereby forming a silicon oxide region underlying said trench;

depositing a second nitride layer overlying said first nitride layer and covering the surface of said second oxide layer on the surface of said trench;

anisotropically etching said second nitride layer and said second oxide layer at the bottom of said trench thereby forming nitride spacers on sidewalls of said trench and exposing said silicon oxide region;

depositing a third oxide layer to fill said trench; and planarizing the surface to expose said first oxide layer completing fabrication of said integrated circuit isolation region.

9. The method according to claim 8 wherein said first oxide layer is grown by wet or dry thermal oxidation to a thickness of between about 200 to 500 Angstroms.

10. The method according to claim 8 wherein said first and second nitride layers are deposited by low pressure chemical vapor deposition (LPCVD) using $NH_3$ and $SiH_4$ at approximately 700° C. to a thickness of between about 500 to 1500 Angstroms.

11. The method according to claim 8 wherein said second oxide layer is grown by dry thermal oxidation at 1000° C. for 30 to 40 minutes to a thickness of between about 200 to 250 Angstroms.

12. The method according to claim 8 wherein said third oxide layer is deposited by high density plasma deposition at a thickness of between about 6000 to 10,000 Angstroms.

13. A method of fabricating an integrated circuit isolation region comprising:

providing a semiconductor substrate;

forming a first oxide layer overlying said substrate;

depositing a first nitride layer overlying said first oxide layer;

patterning and etching away a portion of said first nitride layer and said first oxide layer forming an opening to said substrate;

anisotropically etching said substrate in the area of said opening to form a trench;

thermally growing a second oxide layer on the surface of said trench;

implanting field isolation ions comprising one of a group containing P, As, Ge, and Sb implanted at a dose of between $10^{12}$ to $10^{13}$ atoms/$cm^2$ at an energy of between 30 to 60 keV through said second oxide layer into said substrate at the bottom only of said trench thereby forming an implanted region underlying said trench;

depositing a second nitride layer overlying said first nitride layer and covering the surface of said second oxide layer on the surface of said trench;

anisotropically etching said second nitride layer and said second oxide layer at the bottom of said trench thereby forming nitride spacers on sidewalls of said trench and exposing said silicon oxide region;

depositing a third oxide layer to fill said trench; and planarizing the surface to expose said first oxide layer completing fabrication of said integrated circuit isolation region.

14. The method according to claim 13 wherein said first oxide layer is grown by wet or dry thermal oxidation to a thickness of between about 200 to 500 Angstroms.

15. The method according to claim 13 wherein said first and second nitride layers are deposited by low pressure chemical vapor deposition (LPCVD) using $NH_3$ and $SiH_4$ at approximately 700° C. to a thickness of between about 500 to 1500 Angstroms.

16. The method according to claim 13 wherein said second oxide layer is grown by dry thermal oxidation at 1000° C. for 30 to 40 minutes to a thickness of between about 200 to 250 Angstroms.

17. The method according to claim 13 wherein said third oxide layer is deposited by high density plasma deposition at a thickness of between about 6000 to 10,000 Angstroms.

* * * * *